(12) United States Patent
Watanabe et al.

(10) Patent No.: US 6,791,193 B2
(45) Date of Patent: Sep. 14, 2004

(54) CHIP MOUNTING SUBSTRATE, FIRST LEVEL ASSEMBLY, AND SECOND LEVEL ASSEMBLY

(75) Inventors: Shinya Watanabe, Yokohama (JP); Isao Ozawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/382,020

(22) Filed: Mar. 5, 2003

(65) Prior Publication Data

US 2004/0046262 A1 Mar. 11, 2004

(30) Foreign Application Priority Data

Mar. 8, 2002 (JP) ...................................... P2002-062893

(51) Int. Cl.[7] .............................................. H01L 23/48
(52) U.S. Cl. ...................... 257/777; 257/731; 257/738; 257/780; 257/781
(58) Field of Search ............................... 257/731, 738, 257/777, 780, 781

(56) References Cited

U.S. PATENT DOCUMENTS

| | | | | |
|---|---|---|---|---|
| 5,216,278 A | * | 6/1993 | Lin et al. ..................... | 257/688 |
| 5,506,756 A | * | 4/1996 | Haley ........................... | 361/789 |
| 5,521,435 A | * | 5/1996 | Mizukoshi .................... | 257/698 |
| 5,640,048 A | * | 6/1997 | Selna ............................ | 257/738 |
| 5,734,201 A | * | 3/1998 | Djennas et al. .............. | 257/783 |
| 5,835,355 A | * | 11/1998 | Dordi ............................ | 361/760 |
| 5,895,231 A | * | 4/1999 | Choi et al. ................... | 438/106 |
| 6,078,506 A | * | 6/2000 | Sugahara ...................... | 361/783 |
| 6,313,522 B1 | | 11/2001 | Akram et al. | |
| 6,381,141 B2 | | 4/2002 | Corisis et al. | |
| 6,388,333 B1 | | 5/2002 | Taniguchi et al. | |
| 6,479,758 B1 | * | 11/2002 | Arima et al. ................. | 174/260 |

* cited by examiner

*Primary Examiner*—David Nelms
*Assistant Examiner*—Andy Huynh
(74) *Attorney, Agent, or Firm*—Hogan & Hartson, LLP

(57) ABSTRACT

A chip mounting substrate comprising: a mounting base defined by a first surface and a second surface opposite to the first surface; a plurality of first lands disposed on the first surface, being classified into first and second groups of the first lands; and a plurality of second lands disposed on the second surface so as to face to the first lands, being classified into first and second groups of the second lands.

20 Claims, 11 Drawing Sheets

CHIP MOUNTING SUBSTRATE, FIRST LEVEL ASSEMBLY, AND SECOND LEVEL ASSEMBLY

CROSS REFERENCE TO RELATED APPLICATIONS

This application is based upon and claims the benefit of priority from the prior Japanese Patent Applications No. P2002-062893, filed on Mar. 8, 2002; the entire contents of which are incorporated herein by reference.

BACKGROUND OF THE INVENTION

1. Field of the Invention

The present invention relates to a semiconductor device packaging technology, more specifically to a chip mounting substrate, a first level assembly using the chip mounting substrate, and a second level assembly using the first level assembly.

2. Description of the Related Art

The increase in density and the progress in large-scale integration have continued in semiconductor integrated circuits. Especially in DRAM, thin and small package such as ball grid array (BGA) package has been widely used. In a conventional BGA package, a plurality of connection electrodes are disposed in a lower surface of a rectangular-shaped mounting base, the substrate is defined by the lower surface and an upper surface opposite to the lower surface. The connection electrodes include: a power supply terminal to which a power supply potential is supplied; an ground terminal to which an ground potential is supplied; a selection signal input terminal to which a selection signal of a semiconductor chip is fed; an input and output terminal to which an input is fed or from which output signal is provided; an address terminal to which an address signal is fed; and the like. A chip mounting area is assigned on the upper surface of the mounting base. A semiconductor chip is fixed to the chip mounting area by using an adhesive or the like. Tape-shaped thin film is used as the mounting base.

Recently, high-density packaging is required in semiconductor packaging technology. The packaging area can be reduced by a configuration such that if conventional thin-type semiconductor packages are stacked. However, connection electrodes for superimposing the plurality of semiconductor packages are not provided in the thin-type semiconductor packages. Especially, in the case where plural packages using a BGA tape are stacked, it is not possible to superimpose the packages since the lands for connecting a lower level package with an upper level package are not provided. Therefore, it has been difficult to realize high-density packaging in thin-type semiconductor packages such as a BGA package.

SUMMARY OF THE INVENTION

A chip mounting substrate comprising: a mounting base defined by a first surface and a second surface opposite to the first surface; a plurality of first lands disposed on the first surface, being classified into first and second groups of the first lands; and a plurality of second lands disposed on the second surface so as to face to the first lands, being classified into first and second groups of the second lands.

A first level assembly comprising: a mounting base defined by a first surface and a second surface opposite to the first surface; a plurality of first lands disposed on the first surface, being classified into first and second groups of the first lands; a plurality of second lands disposed on the second surface so as to face to the first lands, being classified into first and second groups of the second lands; a plurality of straight connection paths embedded in the mounting base so as to connect the first group of the first lands with the first group of the second lands just above the first group of the first lands; and a semiconductor chip mounted on a chip mounting area assigned adjacent to the second lands on the second surface.

A second level assembly comprising: a packaging board defined by a first surface assigning a substrate mounting area; a plurality of connection terminals disposed on the substrate mounting area; a plurality of signal terminals disposed around the substrate mounting area on the first surface of the packaging board; a plurality of signal wiring connected to the connection terminals and the signal terminals; a plurality of packaging balls disposed on the connection terminals, respectively; a mounting base disposed above the substrate mounting area, the mounting base being defined by a first surface and a second surface opposite to the first surface having a plurality of first lands disposed on the first surface, the first lands being classified into first and second groups of the first lands, a plurality of second lands disposed so as to face to the plurality of first lands on the second surface, the second lands being classified into first and second groups of the second lands, and a plurality of straight connection paths embedded in the mounting base so as to connect the first group of the first lands with the first group of the second lands just above the first group of the first lands; and a semiconductor chip mounted on a chip mounting area assigned adjacent to the second lands on the second surface.

DETAILED DESCRIPTION OF THE INVENTION

Figure 1:
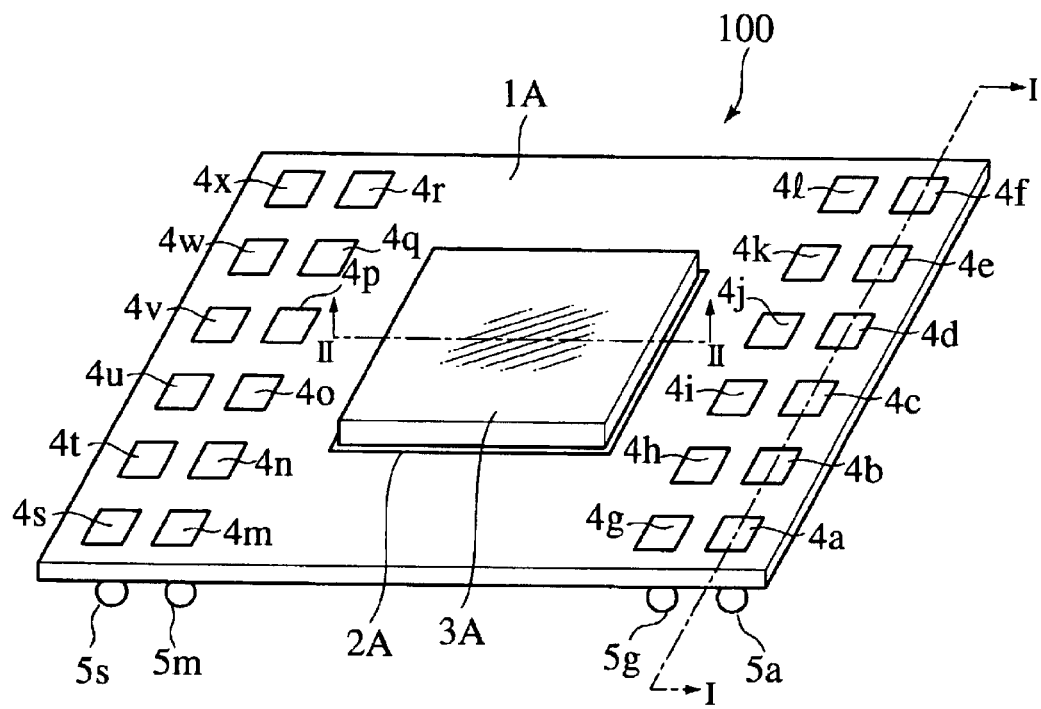
FIG. 1 is a perspective view showing an example of a first level assembly according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings. In the following descriptions, numerous details are set forth such as specific signal values, etc. to provide a thorough understanding of the present invention. However, it will be obvious to those skilled in the art that the present invention may be practiced without such specific details.

Figure 14:
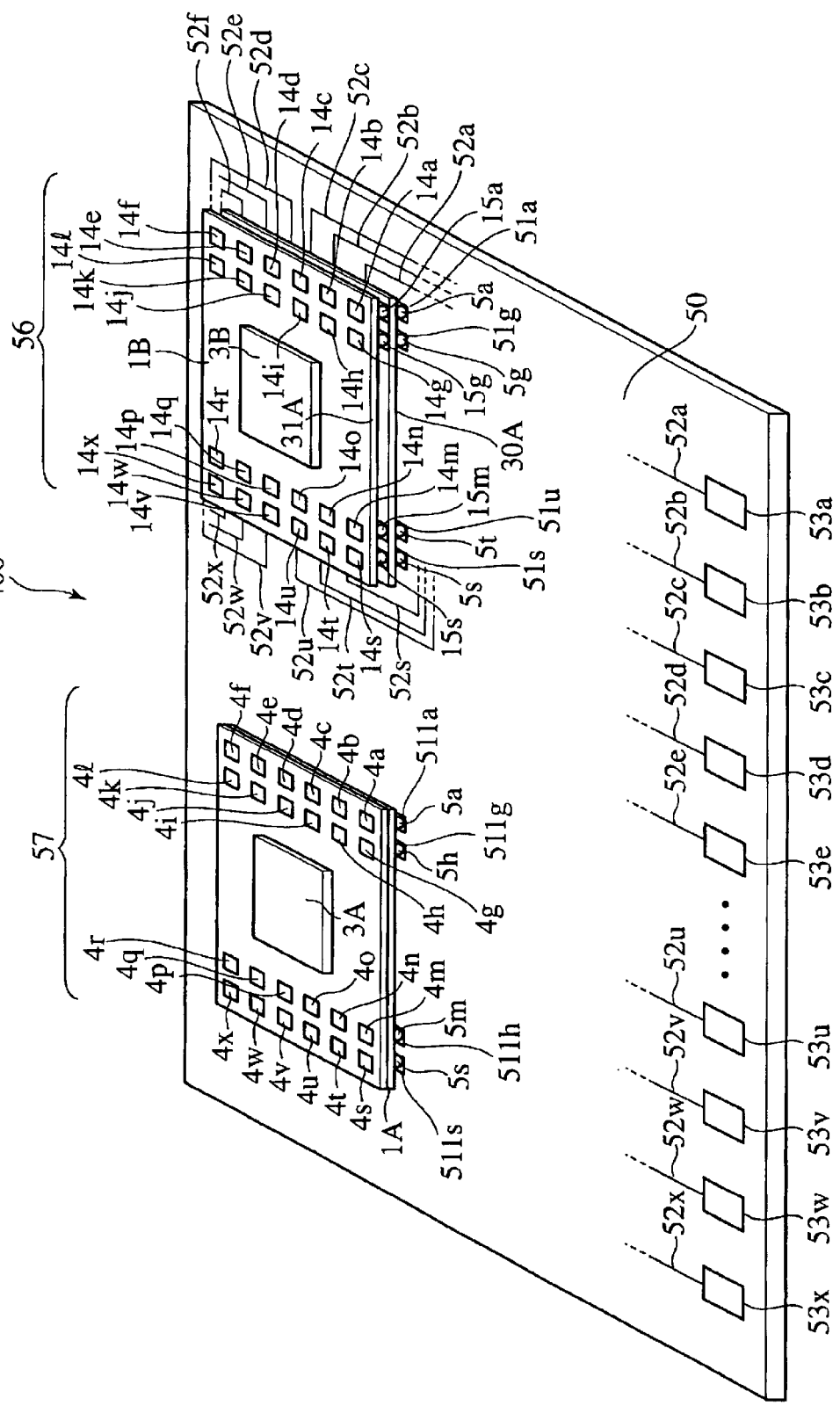
FIG. 14 is a perspective view showing an example of a packaging state of the second level assembly in FIG. 13.

The assembly of levels of electronic devices is classified into several packaging levels in a hierarchy. A first level assembly in the hierarchy indicates an assembly in which a semiconductor chip is mounted on a mounting base and the like. For example, FIGS. 1 to 12 show the first level assemblies 100, 101, 102, 103, 200, and 300. A second level assembly in the hierarchy indicates an assembly in which the first level assembly is mounted on a board. The second level assembly in the hierarchy includes a second level assembly 400 as shown in FIG. 14. A third level assembly indicates an assembly in which the second level assembly is mounted on a motherboard or the like.

First Embodiment

Figure 2:
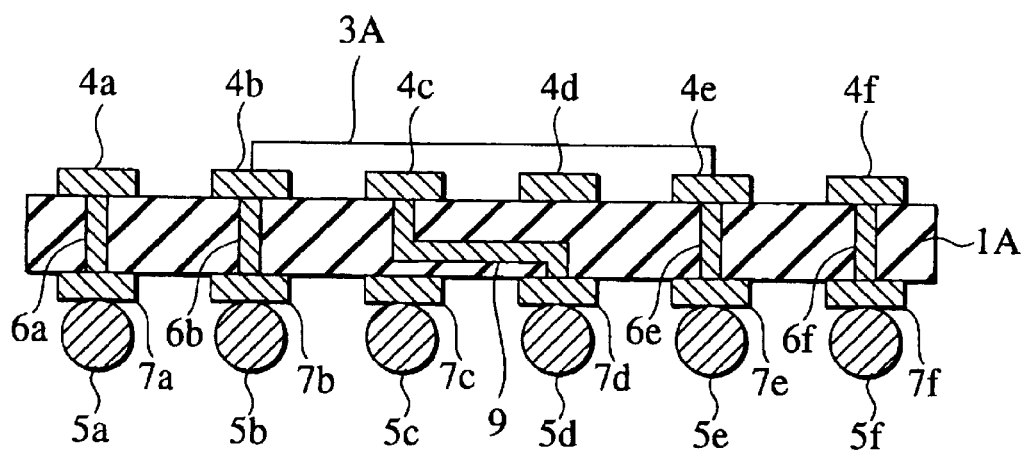
FIG. 2 is an example of a sectional view seen from the I—I line in FIG. 1.

The first level assembly 100 according to a first embodiment of the present invention encompasses, as shown in FIGS. 1 and 2: a mounting base 1A which is defined by a first surface and a second surface opposite to the first surface; first lands 7a, 7b, 7c, . . . , 7f, . . . which are disposed on the first surface; second lands 4a, 4b, 4c, . . . , 4f, which are disposed, opposite to the first lands 7a, 7b, 7c, . . . , 7f, . . . on the second surface; and through-holes 6a, 6b, . . . , 6f, . . . which are embedded in the mounting base 1A, so that some of the first lands 7a, 7b, 7c, . . . , 7f, . . . are connected to some of the second lands 4a, 4b, 4e, . . . , 4f, . . . just above the some of the first lands 7a, 7b, 7c, . . . , 7f, . . . . Joint balls 5a, 5b, 5c, . . . , 5f, . . . are disposed on the first lands 7a, 7b, 7c, . . . , 7f, . . . , respectively. The second lands 4a, 4b, 4c, . . . , 4f, . . . which are opposite to the first lands 7a, 7b, 7c, . . . , 7f . . . are aligned along two lines, two sets of two lines are disposed on opposing sides of a square that defines the periphery of the mounting base 1A. In the center of the second surface of the mounting base 1A, a chip mounting area 2A is assigned adjacent to the second lands 4a, 4b, 4c, . . . , 4f, . . . A semiconductor chip is fixed to the chip mounting area 2A with an adhesive and the like.

As shown in FIG. 2, as to the first lands 7a, 7b, 7c, . . . , 7f, . . . , for example, a first power supply terminal 7a, a first ground terminal 7b, a first inter level connection terminal 7c, a first intra substrate connection terminal 7d, a first input and output terminal 7e, and a first address terminal 7f can be assigned on the first surface of the mounting base 1A. A power supply joint ball 5a, a ground joint ball 5b, a inter level joint ball 5c, an intra substrate joint ball 5d, an input and output joint ball 5e, and an address joint ball 5f are respectively connected to the first power supply terminal 7a, the first ground terminal 7b, the first inter level connection terminal 7c, the first intra substrate connection terminal 7d, the first input and output terminal 7e, and the first address terminal 7f. Furthermore, other than the power supply joint ball 5a, the ground joint ball 5b, the inter level joint ball 5c, the intra substrate joint ball 5d, the input and output joint ball 5e, and the address joint ball 5f, a write terminal joint ball and the like, which are not shown in the drawing are included as the joint balls. The first power supply terminal 7a, the first ground terminal 7b, the first input and output terminal 7e, and the first address terminal 7f (the first group of the first lands) are electrically connected to the second lands 4a, 4b, 4e and 4f (the first group of the second lands) which are just above 7a, 7b, 7e and 7f by the through-holes 6a, 6b, 6e, and 6f (straight connection paths) embedded in the mounting base 1A.

Through-holes 6a, 6b, 6e and 6f, conductive materials are fully embedded, or partly filled so that inner wall films are formed on the inner surface of the through-holes 6a, 6b, 6e and 6f, thus connection between the first surface and the second surface is implemented. The first inter level connection terminal 7c is electrically connected to a semiconductor chip 3A by wiring provided in the mounting base 1A, which is not shown in the drawing. The first intra substrate connection terminal 7d (the second group of the first lands) is connected to a second inter level connection terminal 4c (the second group of the second lands) on the second surface detoured intra substrate connection wiring in a bent through-hole 9 (bent connection path), which has a stair-step shape and is embedded in the mounting base 1A. Note that, a second inter level connection terminal 4c is not connected to the semiconductor chip 3A mounted on the mounting base 1A, nor to the other first lands 7a, 7b, . . . , 7f, . . . .

An second intra substrate connection terminal 4d is provided on the second surface which is opposite to the first intra substrate connection terminal 7d for intra substrate connection in the mounting base 1A interposed therebetween. The second intra substrate connection terminal 4d is not connected to any through-holes 6a, 6b, 6e, and 6f. Furthermore, this second intra substrate connection terminal 4d is also not connected to the semiconductor chip 3A. In FIG. 2, the second inter level connection terminal 4c and the second intra substrate connection terminal 4d are disposed adjacent to each other, however, it is not always necessary for both terminals to be disposed adjacent to each other. That is, the second inter level connection terminal 4c or the second intra substrate connection terminal 4d may be formed in the positions of other second lands, which are not shown in the cross section of FIG. 2.

Figure 3:
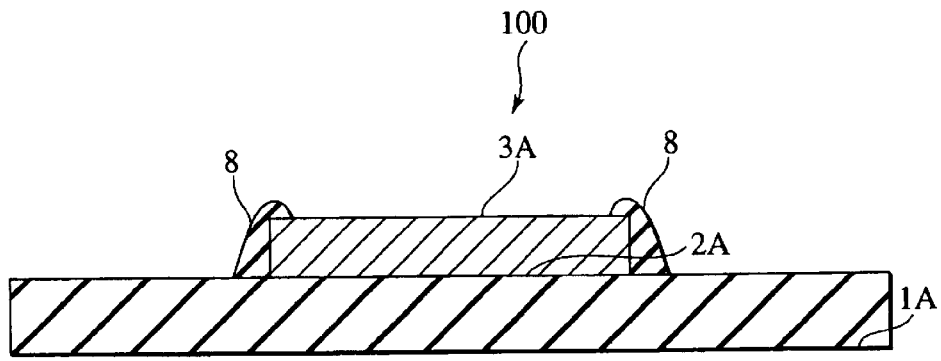
FIG. 3 is an example of a sectional view seen from the II—II line in FIG. 1

As shown in FIG. 3, the outer periphery of the semiconductor chip 3A is covered with a chip passivating film 8. The chip passivating film 8 is provided to prevent damage to the semiconductor chip 3A at the time of conveying and packaging the first level assembly 100. This chip passivating film 8 is implemented by insulating materials such as resin.

Figure 4:
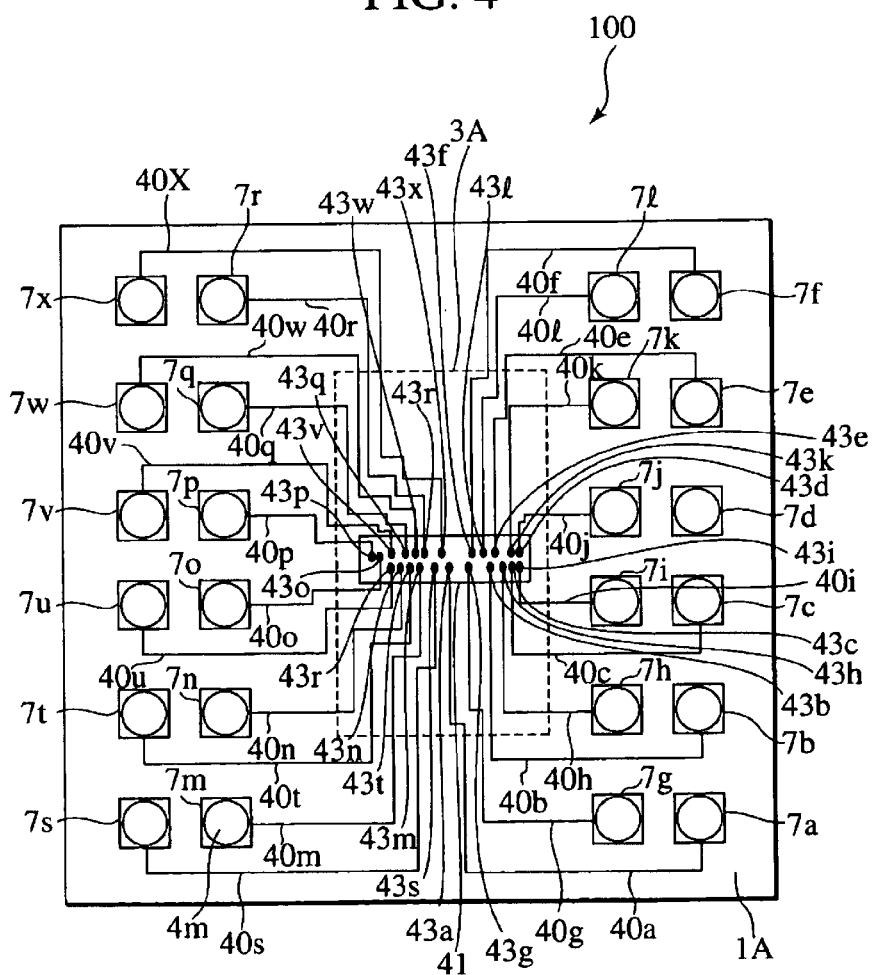
FIG. 4 is an example of a bottom view of the first level assembly shown in FIG. 1.

As shown in FIG. 4, a window 41 is provided in the center of the mounting base 1A. In the window 41, the semiconductor chip 3A is exposed, which is disposed on the second surface of the mounting base 1A. A plurality of pads 43a, 43b, 43c, . . . , 43f, . . . are provided in the semiconductor chip 3A, and those pads are respectively connected to the first lands 7a, 7b, 7c, . . . , 7f, . . . by chip connection wiring 40a, 40b, 40c, . . . , 40f, . . . An example shown in FIG. 4 is the first level assembly 100 called a center pad, however, other pad disposition can be employed as long as the pads 43a, 43b, 43c, . . . , 43f, . . . provided in the semiconductor chip 3A are respectively connectable to the first lands 7a, 7b, 7c, . . . ,7f, . . . Note that, as apparent from FIG. 4, the first intra substrate connection terminal 7d is insulated from the semiconductor chip 3A and the other connection terminals.

Figure 5:
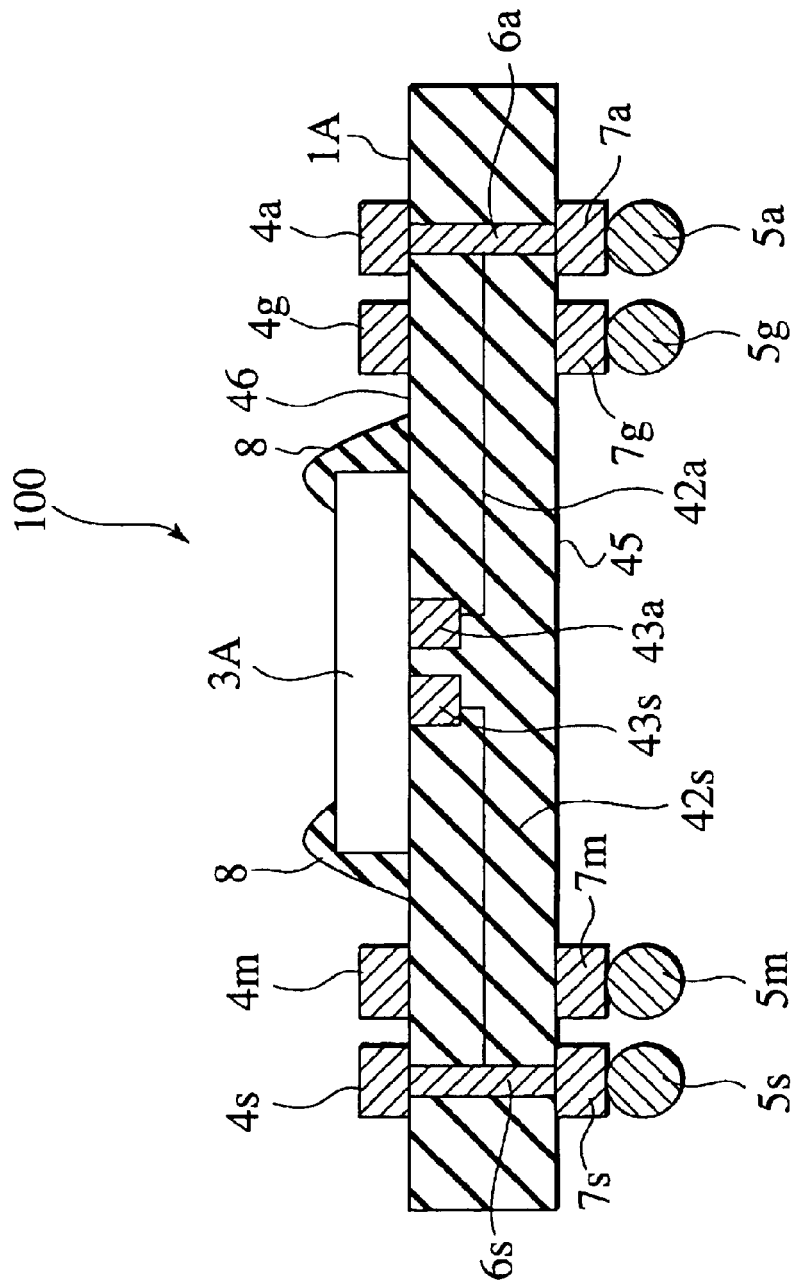
FIG. 5 is a view showing an example of a connection configuration of chip connection wiring from the first lands to pads of the first level assembly according to the first embodiment of the present invention.

As shown in FIG. 5, second wiring layers 42a and 42s are embedded in the mounting base 1A. That is, the mounting base 1A has three metal wiring layers. Specifically, the metal wiring layers include: a first wiring layer 45 provided in the first surface; a third wiring layer 46 provided in the second surface; and the second wiring layers 42a and 42s embedded between the first surface and the second surface. For example, the power supply joint ball 5a is connected to the through-hole 6a from the first power supply terminal 7a, and further connected to the embedded pad 43a through the second chip connection wiring 42a in the second wiring layer provided in the mounting base 1A. Similar to the power supply joint ball 5a, the joint ball 5s is connected to the embedded pad 43s through the second chip connection wiring 42s in the through-hole 6s from a first land 7s.

The mounting base 1A shown in FIGS. 1 to 5 employs a fan-out type substrate. That is, the size of the mounting base 1A is larger than that of the chip mounting area 2A. A thin tape such as a BGA tape is used as the mounting base 1A. As to the semiconductor chip 3A, for example, silicon having a thickness of about 0.28 to 0.45 mm can be employed. As to the second lands 4a, 4b, 4c, . . . , 4f, . . . and the first lands 7a, 7b, 7c, . . . , 7f, . . . , conductive thin films such as aluminum and copper are usable. As the joint balls 5a, 5b, 5c, . . . , 5f, solder balls are usable. The second lands 4a, 4b, 4c, . . . , 4f, . . . , and the first lands 7a, 7b, 7c, . . . , 7f, . . . can be provided respectively on each of the first surface and the second surface with number of about 40 to 60 balls. For example, in the case of 256 MB SRAM, the following are provided: 13 address input pins; two bank select pins; 16 data input and output pins; a chip select pin, a row address pin, a column address pin, a write enable pin, an output disable pin, a write mask pin, a clock input pin, and a clock enable pin; three power supply pins (Vcc) and three power supply pins (GND), four power supply pins (VccQ) and 4 power supply pins (VssQ); and a non-connected pin. The number of the second lands 4a, 4b, 4c, . . . , 4f, . . . and the first lands 7a, 7b, 7c, . . . , 7f, . . . can be changed appropriately. The second lands 4a, 4b, 4c, . . . , 4f, . . . may be embedded in the second surface of the mounting base 1A. The first lands 7a, 7b, 7c, . . . , 7f, . . . may be embedded in the first surface of the mounting base 1A.

As described above, according to the first level assembly 100 of the first embodiment of the present invention, the first lands 7a, 7b, 7c, . . . , 7f, . . . and the second lands 4a, 4b, 4c, . . . , 4f, . . . are respectively disposed on the first surface and the second surface of the mounting base 1A. Accordingly, plural thin-type mounting bases 1A such as BGA tape can be stacked into a multi chip module (MCM). Moreover, for the first level assemblies 100 shown in FIGS. 1 to 5, all lands on the same surface have the same size. Therefore, when the first level assembly 100 is mounted on the packaging substrate, or when plural first level assemblies 100 are stacked, for example, damage to the lands can be prevented, which is caused by applying high pressure to certain lands. A non-connection state of certain lands can be also prevented because lands are all the same size. Therefore, according to the first level assembly 100 shown in FIGS. 1 to 5, the mounting substrate capable of high-density packaging, and the first level assembly 100 using the mounting substrate can be provided.

Modification1-1

Figure 6:
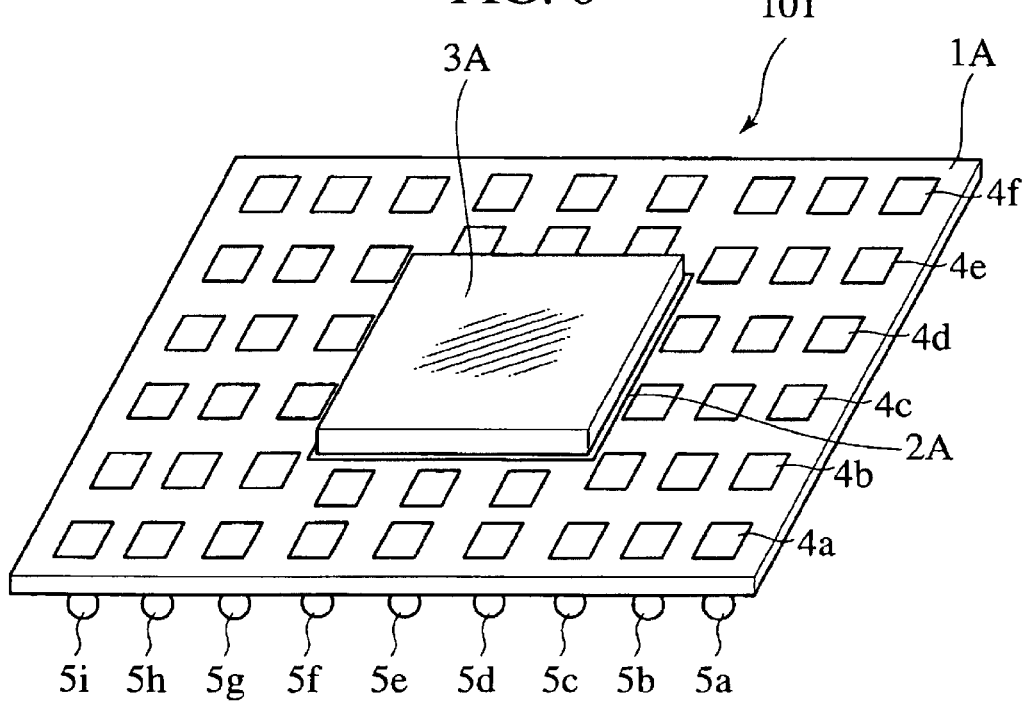
FIG. 6 is a perspective view showing an example of a first level assembly according to a first modification of the first embodiment.

In the first level assembly 101 according to a first modification of the first embodiment of the present invention, as shown in FIG. 6, the plurality of second lands 4a, 4b, 4c, . . . , 4f, . . . are provided in the form of a matrix over the remaining area of the second surface of the mounting base 1A where the chip mounting area 2A is disposed on. The joint balls 5a, 5b, 5c, . . . , 5i, . . . are embedded on the first surface side of the mounting base 1A so as to correspond accordingly to the second lands 4a, 4b, 4c, . . . , 4f, . . . of the second surface side through the first lands, which are not shown in FIG. 6. The constitution of other components is similar to that in the first level assembly 100 shown in the first embodiment. Since the first level assembly 101 shown in FIG. 6 also includes the first lands and the second lands on the first surface and the second surface of the thin-type mounting base 1A, respectively, the thin-type first level assemblies 101 is implemented by BGA tape, can be mounted in high density being stacked in multiple levels.

Modification1-2

Figure 7:
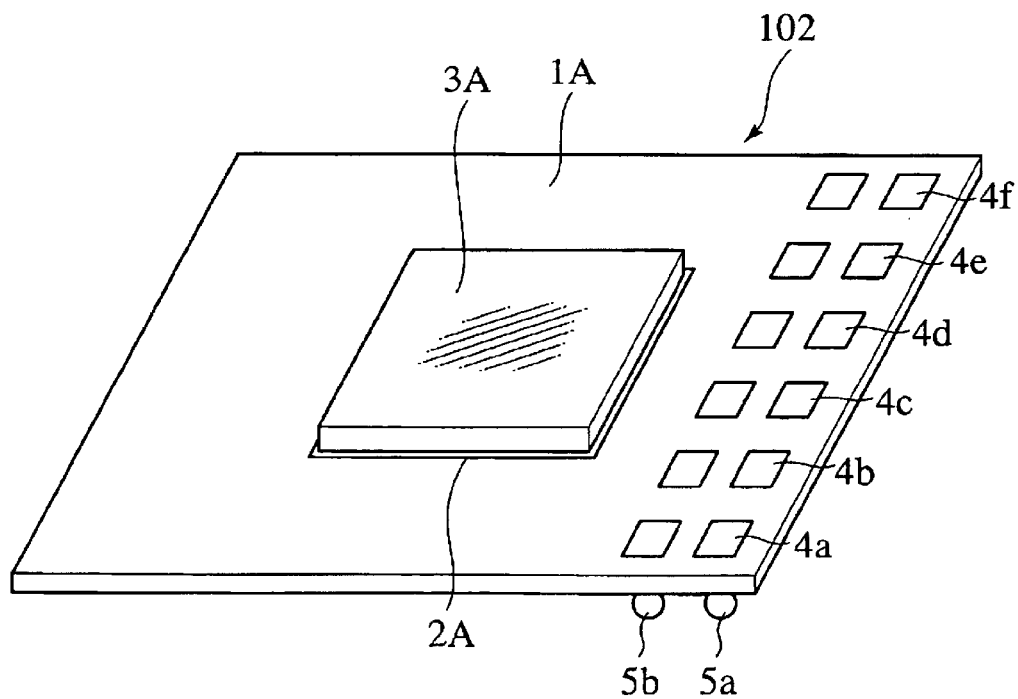
FIG. 7 is a perspective view showing an example of a first level assembly according to a second modification of the first embodiment.

In the first level assembly 102 according to a second modification of the first embodiment of the present invention, as shown in FIG. 7, the second lands 4a, 4b, 4c, . . . , 4f, . . . are aligned along two lines on one side of a square, which defines the periphery of the mounting base 1A. The opposing side is a blank space. The joint balls 5a, 5b, . . . are connected to the first lands which are omitted in the drawing, disposed on the first surface of the mounting base 1A. Corresponding accordingly, the second lands 4a, 4b, 4c, . . . , 4f, . . . are disposed in a position opposite to the first lands connected to the joint balls 5a, 5b, . . . The first lands of which are not shown in FIG. 7 are connected to the joint balls 5a, 5b, . . . In the first level assembly 102 shown in FIG. 7, the thin-type first level assemblies can be mounted in high density by being stacked in multiple levels, such as the first level assembly 100 of the first embodiment.

Modification1-3

Figure 8:
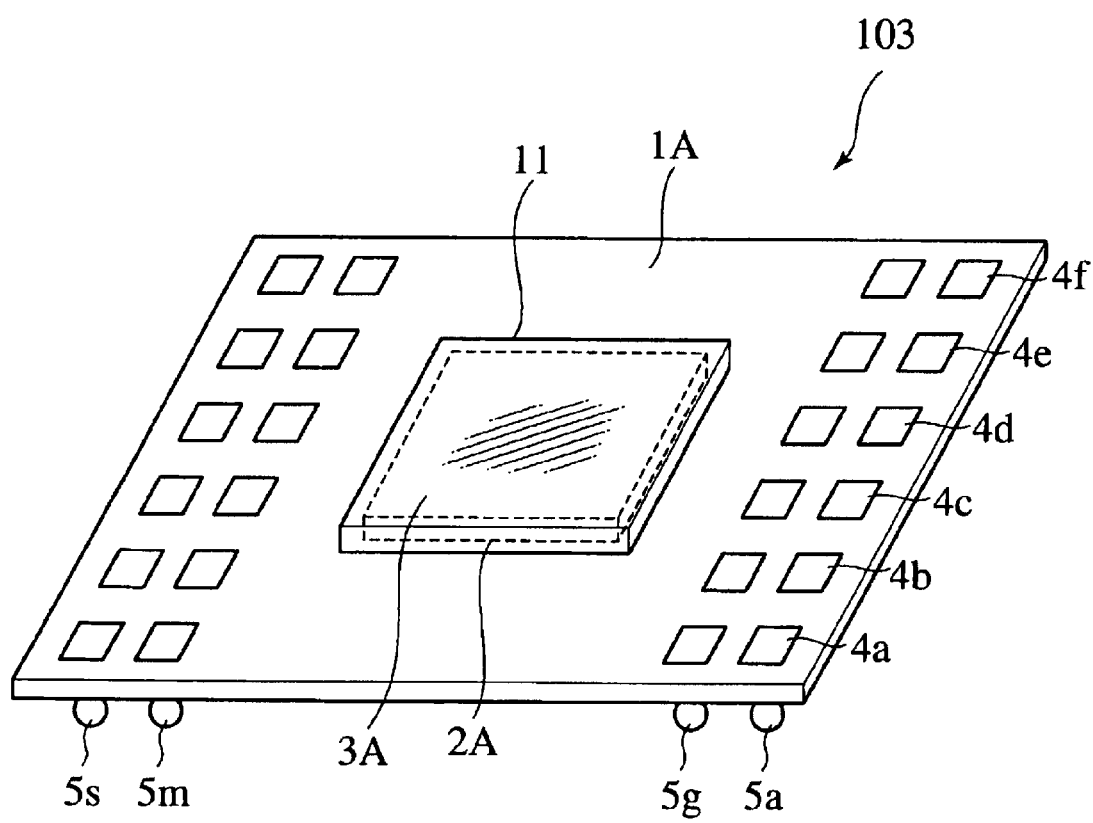
FIG. 8 is a perspective view showing an example of a first level assembly according to a third modification of the first embodiment.

In the first level assembly 103 according to a third modification of the first embodiment of the present invention, as shown in FIG. 8, a heat sink 11 is disposed so as to surround the circumference of the semiconductor chip 3A mounted on the second surface of the mounting base 1A. The heat sink 11 is used a metal such as aluminum. The first level assembly 103 shown in FIG. 8 can diseminate heat efficiently, which is generated from the semiconductor chip 3A, efficiently. Accordingly, when the plurality of first level assemblies are stacked in multiple levels, damage to the first level assembly 103 can be prevented by diseminating the heat efficiently, which is generated from semiconductor chips, efficiently.

Second Embodiment

Figure 9:
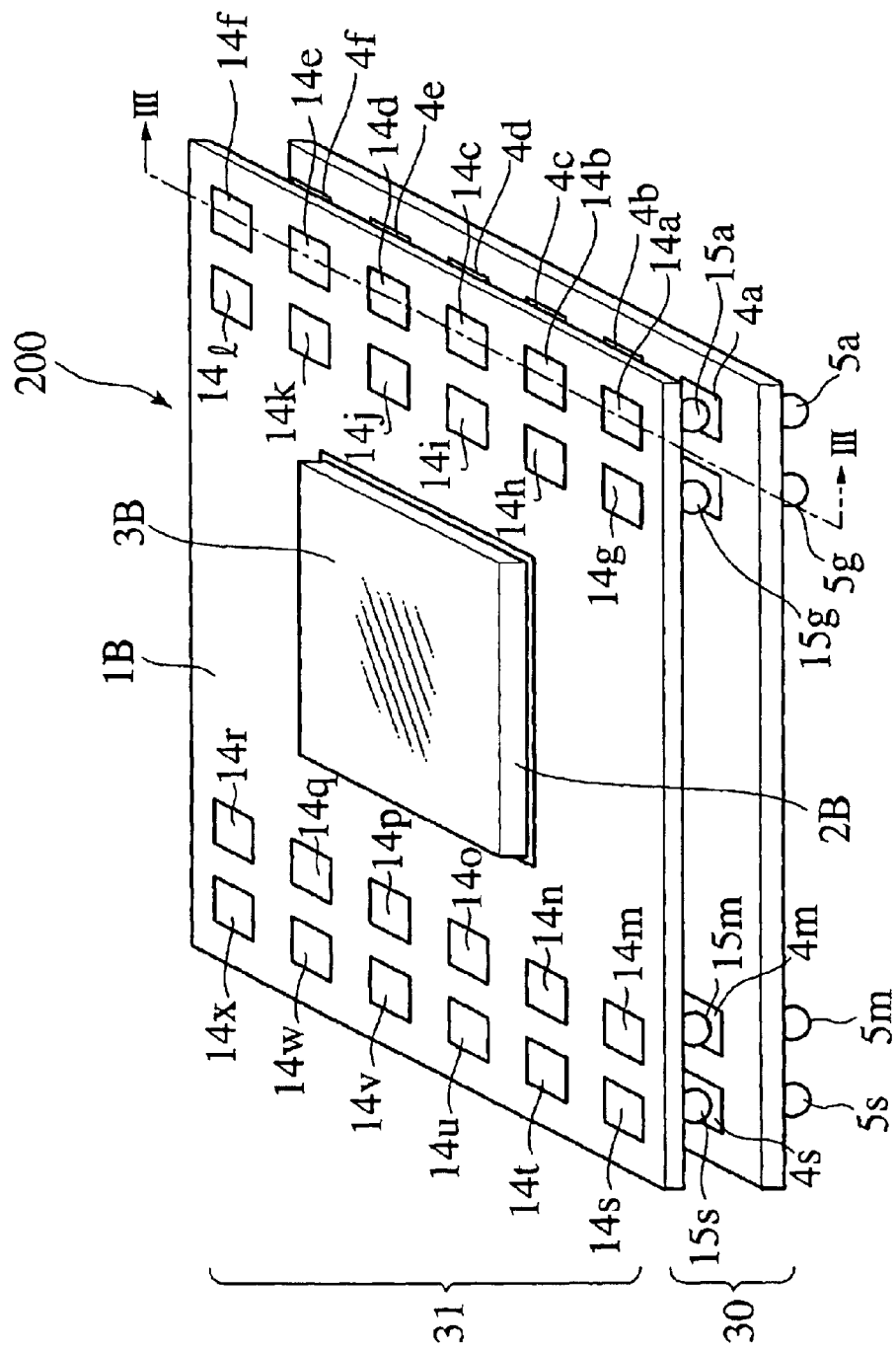
FIG. 9 is a perspective view showing an example of a first level assembly having a two-level constitution according to a second embodiment of the present invention.
Figure 10:
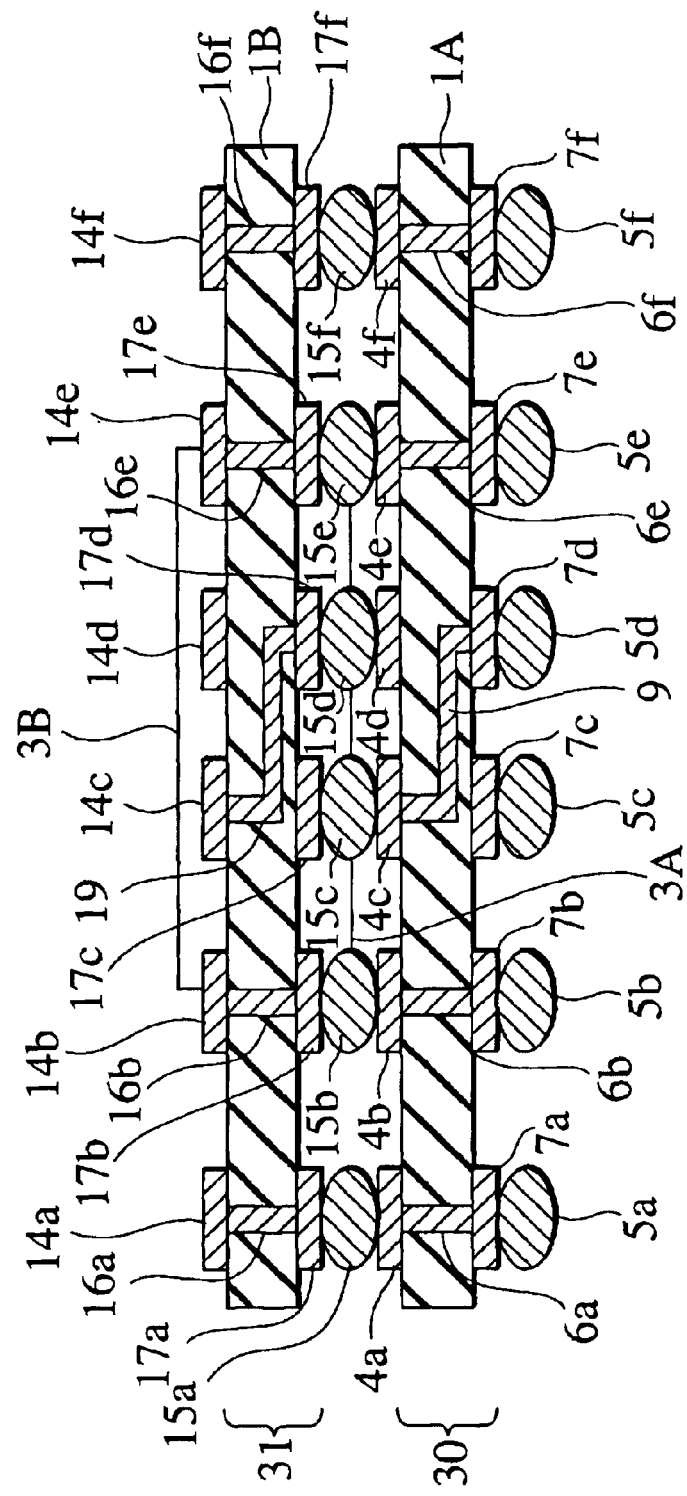
FIG. 10 is an example of a sectional view seen from the line III—III in FIG. 9

As shown in FIGS. 9 and 10, in the first level assembly 200 according to a second embodiment of the present invention, a third surface of a upper level assembly 31 is disposed so as to face to a second surface of a first level assembly 30. That is, the first level assembly 200 as shown in FIGS. 9 and 10 further includes: a upper level mounting base 1B defined by the third surface and a fourth surface opposite to the third surface; upper level first lands 17a, 17b, 17c, . . . , 17f, . . . disposed on the third surface; and upper level second lands 14a, 14b, 14c, . . . , 14f, . . . disposed so as to face to the upper level first lands 17a, 17b, 17c, . . . , 17f, . . . respectively on the fourth surface. Second through-holes 16a, 16b, 16e, . . . , 16f . . . are embedded in the upper level mounting base 1B, so that some of the upper level first lands 17a, 17b, 17c, . . . , 17f, . . . are connected to some of the upper level second lands 14a, 14b, 14e, . . . , 14f, . . . which are just above the some of first lands 17a, 17b, 17c, . . . , 17f, . . . , respectively. Joint balls 15a, 15b, 15c, . . . , 15f, . . . are disposed in the upper level first lands 17a, 17b, 17c, . . . , 17f . . . respectively of the first level assembly 31. The upper level second lands 14a, 14b, 14c, . . . , 14f, . . . and the upper level first lands 17a, 17b, 17c, . . . , 17f, . . . are aligned along two sets of two lines are disposed, on opposing the sides of a square that defined the periphery on the second mounting base 2A. In the center of the fourth surface of the upper level assembly 31, an upper level chip mounting area 2B is assigned adjacent to the upper level second lands 14a, 14b, 14c, . . . , 14f, . . . A upper level semiconductor chip 3B as an upper level chip is fixed to the second chip mounting area 2B with an adhesive or the like. Note that, since a fan-out type substrate is used in FIG. 9, the upper level second lands 14a, 14b, 14c, . . . , 14f, . . . of the upper level assembly 31 are not disposed in the positions just above the first semiconductor chip 3A of the first level assembly 30.

As shown in FIG. 10, a power supply terminal 17a, a ground terminal 17b, a input and output terminal 17e, and an address terminal 17f of the upper level assembly 31(the first group of the upper level first lands) are respectively connected to the upper level second lands 14a, 14b, 14e, and 14f (the first group of the upper level second lands) on the fourth surface of the upper mounting base 1B, by the second through-holes 16a, 16b, 16e, and 16f, which are embedded in the upper level mounting base 1B.

A first inter level connection terminal 17c is electrically connected to the upper level semiconductor chip 3B by wiring, provided in the upper level mounting base 1B. The first intra substrate connection terminal 17d (the second group of the upper level first lands) is connected to an inter level connection terminal 14c (the second group of the upper level first lands) on the fourth surface of the second mounting base 1B by a second bent through-hole 19 (bent connection path), which has a stair-step shape and is provided in the second mounting base 1B. The second inter level connection terminal 14c is not connected to the upper level semiconductor chip 3B, nor to the other upper level second lands 14a, 14b, 14c, . . . , 14f, . . . .

The first inter level connection terminal 17c of the upper level assembly 31 works as a selection signal input terminal of the upper level semiconductor chip 3B. That is, the first inter level connection terminal 17c connected to the upper level semiconductor chip 3B is connected to the second inter level connection terminal 4c of the first level assembly 30 through the inter level joint ball 15c, and is further connected to the first intra substrate connection terminal 7d and the intra substrate joint ball 5d by the bent through-hole 9. Accordingly, it is possible to operate the upper level semiconductor chip 3B of the upper level assembly 31 independent of the first level assembly 30 by feeding the selection signal from the intra substrate joint ball 5d of the first level assembly 30. A description of the other components is omitted because those components have the same constitution as that of the components in FIGS. 1 to 5.

As described above, according to the first level assembly 200 of the second embodiment of the present invention, The thinner assembly can be made since the plate-shaped first level assembly 30 and the upper level assembly 31 are implemented by the BGA tape or the like, are stacked in two levels. In addition, assuming that each of the first level assembly 30 and the upper level assembly 31 are semiconductor recording devices, the recording capacitance of two first level assemblies can be obtained in an area required for one first assembly, by stacking the first level assembly 30 and the upper level assembly 31 longitudinally, whereby the recording capacitance can be increased. For example, as the first level assembly 30 and the upper level assembly 31 shown in FIG. 9, a DRAM, a flash memory, a SRAM, a mixed memory logic and the like are applicable. In addition, as shown in FIG. 10, since the first inter level connection terminal 7c connected to the first semiconductor chip 3A of the first level assembly 30, and the first inter level connection terminal 17c connected to the upper level semiconductor chip 3B of the upper level assembly 31 function as chip selection terminals independent of the other terminals, it is possible to operate the first level assembly 30 and the upper level assembly 31 independently. As described in the first embodiment, all of the second lands 4a, 4b, 4c, . . . , 4f . . . and the first lands 7a, 7b, 7c, . . . , 7f . . . of the first level assembly 30, and the upper level second lands 14a, 14b, 14c, . . . , 14f . . . , and the upper level first lands 17a, 17b, 17c, . . . , 17f . . . of the upper level assembly 31 have the same topology and the same shape. Accordingly, when the first level assembly 30 and the upper level assembly 31 are mounted in a stacked manner, the upper level assembly 31 can adhere to the first level assembly 30 without being conscious of the third surface and the fourth surface of the second mounting base 1B. Therefore, it is possible to achieve an improvement in the packaging operation efficiency.

Figure 11:
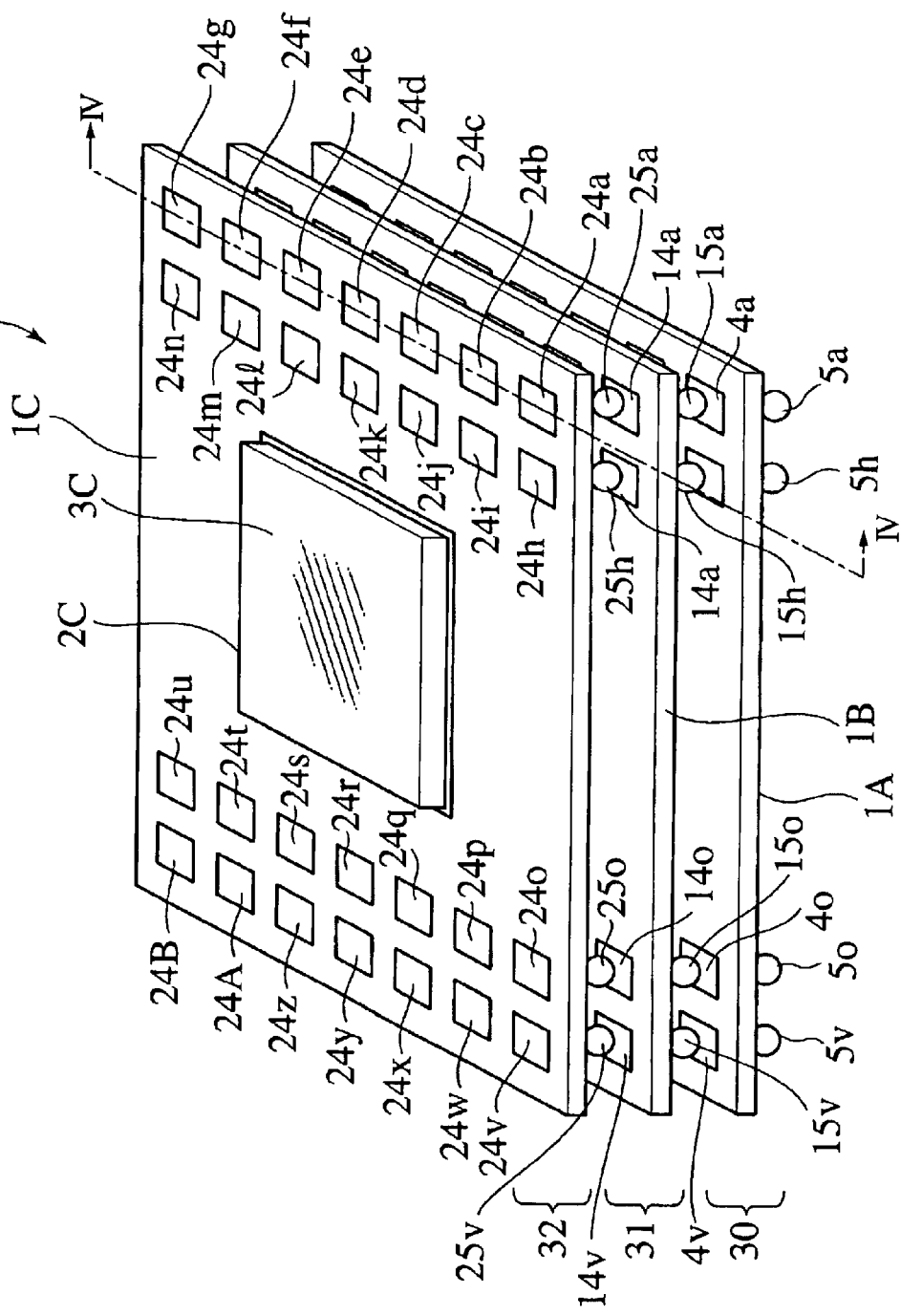
FIG. 11 is a perspective view showing an example of a first level assembly having a three-level stacked structure according to a modification of the second embodiment of the present invention.

Note that, as shown in FIG. 10, when the first level assemblies 100 to 103 shown in FIGS. 1 to 5 are stacked in two levels, at least one or more of the second intra substrate connection terminal 4d and the first intra substrate connection terminal 17d are included in the second lands 4a, 4b, 4c, . . . , 4f, . . . of the first level assembly 30 and the upper level first lands 17a, 17b, 17c, . . . , 17f, . . . of the upper level assembly 31. When the first level assemblies 100 to 103 are stacked in three levels, as shown in FIG. 11, at least two or more of the first lands for upper and lower connection, and the second lands for upper and lower connection are included in the same position of the respective upper level assembly 32 disposed in the uppermost level, the upper level assembly 31 disposed in the middle level, and the first level assembly 30 disposed in the lowermost level. When the first level assemblies are stacked in n levels (n is a natural number that is 2 or more), (n−1) of the first intra substrate connection terminals, and (n−1) of the second intra substrate connection terminals are included, respectively.

When the first level assembly 30 and the upper level assembly 31 are stacked as the first level assembly 200 shown in FIG. 9, the sum of the thickness of the second lands 4a, 4b, 4c, . . . , 4f . . . , and the thickness of the upper level first lands 17a, 17b, 17c, . . . , 17f, . . . are formed being equal to or larger than that of the first semiconductor chip 3A for avoiding the compression of the first semiconductor chip 3A in the lower level. For example, in the semiconductor module shown in FIG. 10, assuming that the thickness of each of the first semiconductor chip 3A and the upper level semiconductor chip 3B is about 0.3 mm, the thickness of the second lands 4a, 4b, 4c, . . . , 4f, . . . , the upper level second lands 14a, 14b, 14c, . . . , 14f, . . . , the first lands 7a, 7b, 7c, . . . , 7f, . . . and the upper level first lands 17a, 17b, 17c, . . . , 17f, . . . are set to about 0.3 mm. The semiconductor chip 3A and the upper level semiconductor chip 3B each having a thickness of 0.28 to 0.48 mm, and the BGA tape having the thickness of about 190 mm is usable, the BGA tape being used as the first mounting base 1A, and the second mounting base 1B. The BGA tape to be employed is one with an adhesive part of 50 mm, an insulation film of 75 mm, copper wiring of 15 mm, nickel wiring of 2 mm, gold wiring of 0.2 mm and an insulation film of 30 mm.

Modification2-1

Figure 12:
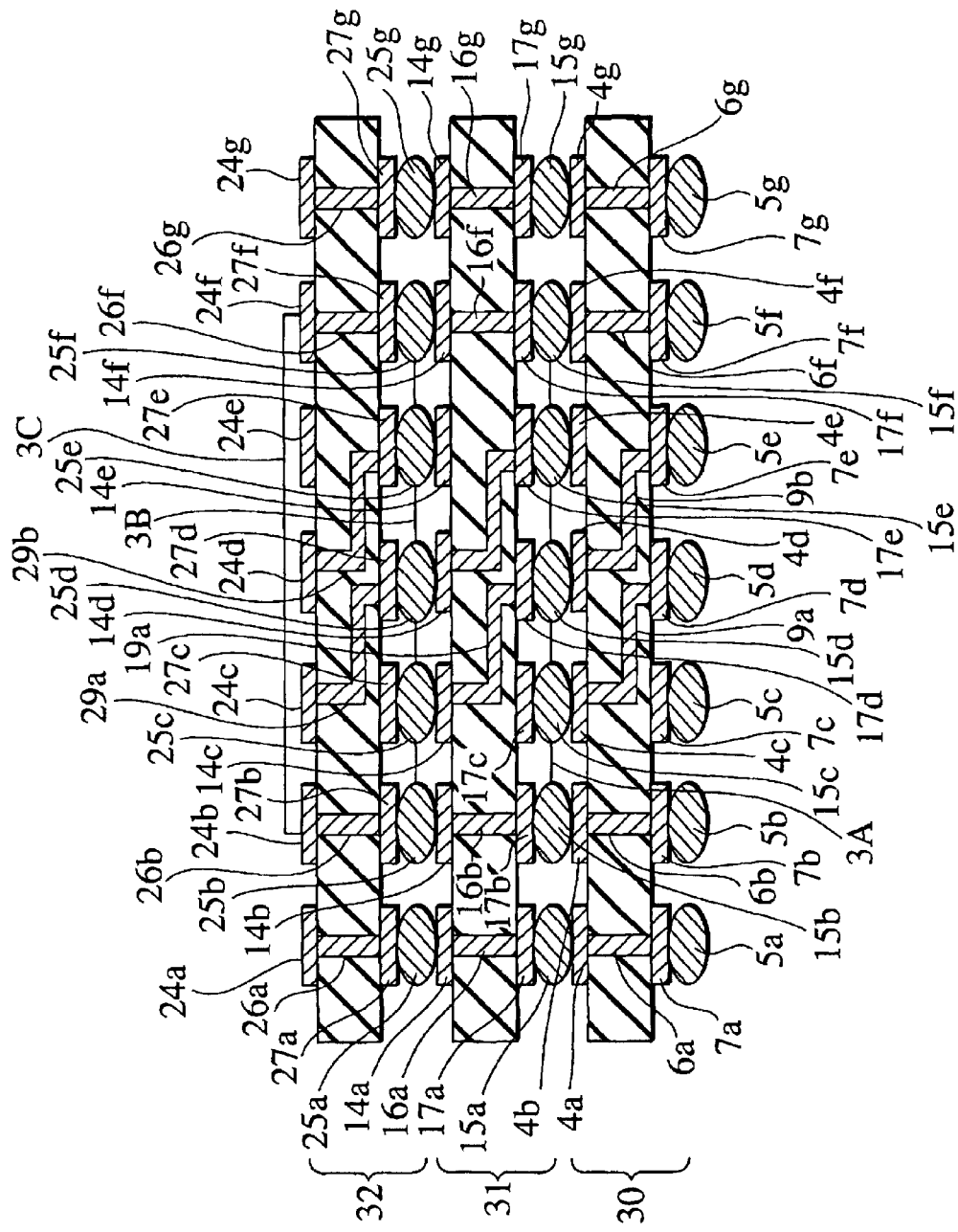
FIG. 12 is an example of a sectional view seen from the line IV—IV in FIG. 11.

A structure will be described in which the first level assemblies 100 are stacked in three levels. As shown in FIGS. 11 and 12, the third surface of the upper level assembly 31 including the second mounting base 1B is disposed so as to face to the second surface of the first level assembly 30. Furthermore, a fifth surface of the upper level assembly 32 including a upper level mounting base 1C as the upper level mounting base is disposed so as to face to the fourth surface of the upper level assembly 31.

As shown in FIG. 12, the first first lands 7a, 7b, 7f, and 7g of the first level assembly 30 are respectively connected to the joint balls 15a, 15b, 15f, and 15g which are connected to the second lands 4a, 4b, 4f, and 4g through the first through-holes 6a, 6b, 6f, and 6g. The upper level first lands 17a, 17b, 17f, and 17g of the upper level assembly 31 connected to the joint balls 15a, 15b, 15f, and 15g are respectively connected to the upper level second lands 14a, 14b, 14f, and 14 through the second through-holes 16a, 16b, 16f, and 16g (straight connection paths). Joint balls 25a, 25b, 25f, and 25g of the upper level assembly 32 are respectively connected to the upper level second lands 14a, 14b, 14f, and 14g. Third first lands 27a, 27b, 27f, and 27g, which are connected to the joint balls 25a, 25b 25f and 25g are connected to third second lands 24a, 24b, 24f, and 24g through third through-holes 26a, 26b, 26f, and 26g, (straight connection paths) respectively. The first first inter level connection terminal 7c is electrically connected to the first semiconductor chip 3A by wiring, which is provided in the first mounting base 1A and is not shown in the drawing. The first intra substrate connection terminal 7d is connected to the first second inter level connection terminal 4c of the second surface through the first bent through-hole 9 provided in the first mounting base 1A. The second lower surface connection dedicated terminal 17c, which is connected to the first second inter level connection terminal 4c through the joint ball 15c, is electrically connected to the upper level semiconductor chip 3B by wiring which is provided in the second mounting base 1B and is not shown in the drawing. The first intra substrate connection terminal 7e is connected to the first upper surface connection dedicated terminal 4d by the first bent through-hole 9b provided in the first mounting base 1A. The second first intra substrate connection terminal 17d, which is connected to the first upper surface connection dedicated terminal 4d through the joint ball 15d, is connected to the second upper surface connection dedicated terminal 14c by a second bent through-hole 19a (bent connection path) provided in the second mounting base 1B. The third first inter level connection terminal 27c, which is connected to the second upper surface connection dedicated terminal 14c through the joint ball 25c, is electrically connected to the third semiconductor chip 3C by wiring, which is provided in the upper level mounting base 1C and is not shown in the drawing. The first intra substrate connection terminal 17e is connected to the second intra substrate connection terminal 14d by the bent through-hole 19b (bent connection path) provided in the upper level mounting base 1B. A first intra substrate connection terminal 27d, which is connected to the second intra substrate connection terminal 14d through the joint ball 25d, is connected to a second inter level connection terminal 24c by a third bent through-hole 29a (bent connection path) provided in the upper level mounting base 1C. A third first intra substrate connection terminal 27e, which is connected to the second intra substrate connection terminal 14e through the joint ball 25e, is connected to a second inter level connection terminal 24c by a bent through-hole 29b (bent connection path) embedded in the upper level mounting base 1C. The first second intra substrate connection terminal 4e, the second intra substrate connection terminal 14e, and the second intra substrate connection terminal 24e are not connected to the semiconductor chip 3A, the upper level semiconductor chip 3B, and the upper level semiconductor chip 3C. Note that, the upper level second lands 14a, 14b, 14c, . . . , 14g, . . . , the joint balls 25a, 25b, 25c, . . . , 25g, . . . , and the upper level first lands 27a, 27b, 27c, . . . , 27g, . . . adhere to each other by a thermo-compression bonding or the like, such as the first level assembly 200 shown in FIGS. 9 and 10.

According to the first level assembly 300 shown in FIG. 11, since the first level assembly 30, the upper level assembly 31, and the upper level assembly 32, which is implemented by the BGA tape and the like, are stacked in three levels, the volume of the assembly can be made smaller. In addition, the first inter level connection terminal 7c, and the first intra substrate connection terminal 7d and 7e function as the chip selection terminals of the first level assembly 30, the upper level assembly 31, and the upper level assembly 32, whereby it is possible to operate the first level assembly 30, the upper level assembly 31, and the upper level assembly 32 independently.

Third Embodiment

Figure 13:
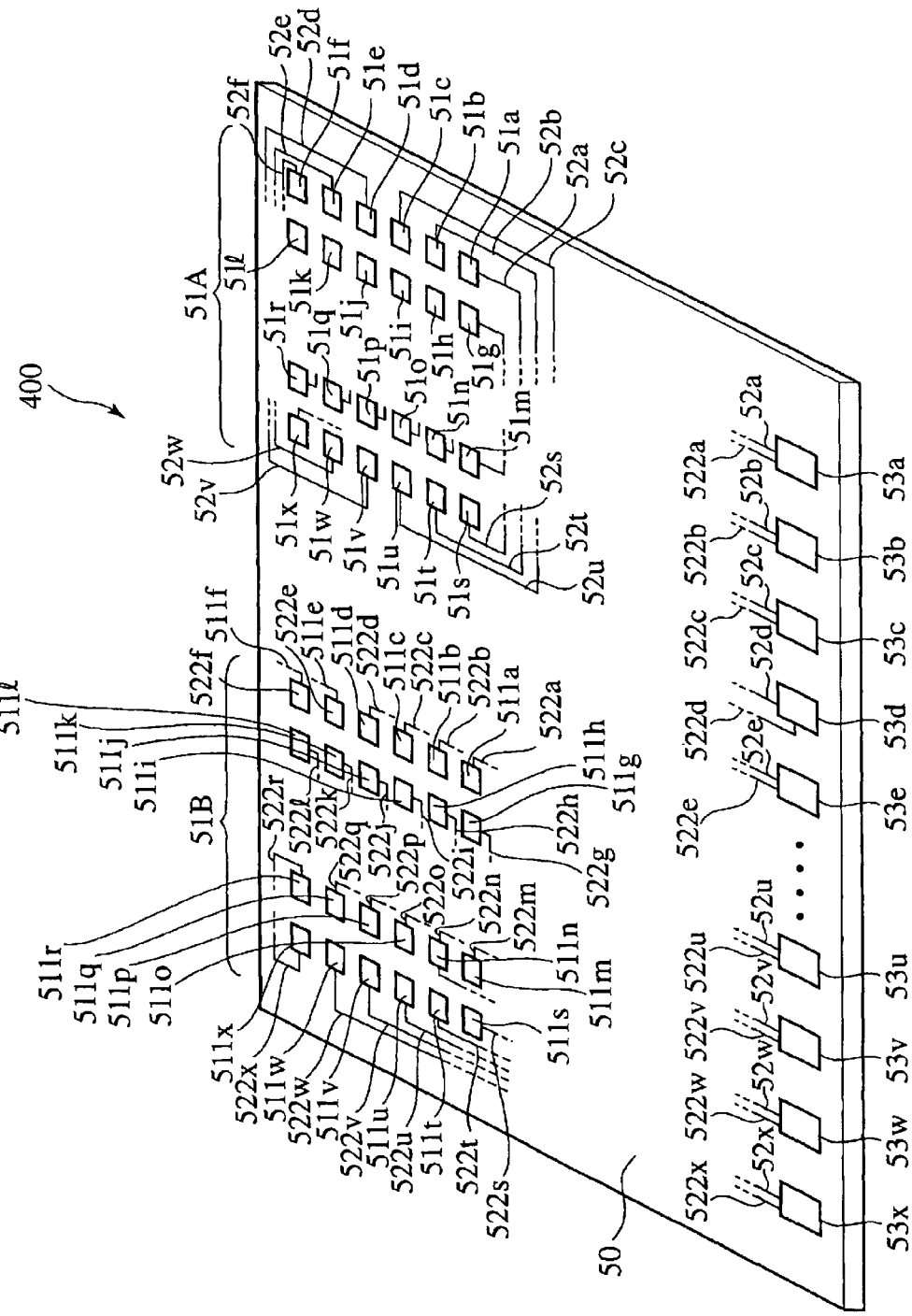
FIG. 13 is a perspective view showing an example of a mounting substrate of a second level assembly according to a third embodiment of the present invention.

A second level assembly 400 according to a third embodiment of the present invention includes, as shown in FIGS. 13 and 14: a packaging substrate 50 defined by a first surface having a first substrate mounting area 51A; first connection terminals 51a, 51b, 51c, . . . , 51x, . . . , which are aligned and disposed having intervals therebetween in the first substrate mounting area 51A of the first surface; signal terminals 53a, 53b, 53c, . . . , 53x, . . . which are disposed in the vicinity of the first substrate mounting area 51A; first signal wiring 52a, 52b, 52c, . . . , 52x, . . . which are connected to the first connection terminals 51a, 51b, 51c, . . . , 51x, . . . and the signal terminals 53a, 53b, 53c, . . . , 53x, . . . ; and a first level assembly 56 which is disposed in the first substrate mounting area 51A. The packaging substrate 50 further includes a second substrate mounting area 51B on the first surface thereof. In a second substrate mounting area 51B, second connection terminals 511a, 511b, 511c, . . . , 511x, . . . are disposed having intervals therebetween. The second connection terminals 511a, 511b, 511c, . . . , 511x, . . . are connected to the signal terminals 53a, 53b, 53c, . . . ,53x, . . . by second signal wiring 522a, 522b, 522c, . . . , 522x, . . . A first level assembly 57 is disposed in the second substrate mounting area 51B.

On the first level assemblies 56 and 57, for example, the first level assemblies 100 to 103, 200, and 300 shown in FIGS. 1 to 12 can be mounted. In FIG. 14, in the first substrate mounting area 51A, the first level assembly 56 having the same constitution as that of the first level assembly 200 is disposed. In the second substrate mounting area 51B, the first level assembly 57 having the same constitution as that of the first level assembly 100 shown in FIG. 1 is disposed. The first level assembly 57 includes: the first mounting base 30 as a second mounting base; first lands which are disposed on the first surface of the first mounting base 30, not shown in FIG. 14; and the second lands 4a, 4b, 4c, . . . , 4x, . . . which are disposed on the second surface so as to face to the first lands. In the second surface, which is adjacent to the second lands 4a, 4b, 4c, . . . , 4x, . . . , the semiconductor chip 3A as the second semiconductor chip is disposed. As shown in FIG. 14, packaging substrate joint balls 5a, 5b, 5c, ..., 5x ... of the first level assembly 56 are disposed on the first connection terminals 51a, 51b, 51c, ..., 51x, ..., which are disposed in the substrate mounting substrate 51A. The first lands of the mounting base 30 of the first level assembly 56, which is not shown in FIG. 14, are connected so as to be in contact with the packaging substrate joint balls 5a, 5b, 5c, ..., 5x, ... respectively. The joint balls 15a, 15b, 15c, ..., 15x, ... are respectively disposed in the second lands on the second surface of the mounting base 30, which are not shown in the drawing. Then, the first lands are disposed so as to be in contact with the joint balls 15a, 15b, 15c, ..., 15x, ... in the second mounting base 31 as in the upper surface mounting base, which is not shown in FIG. 14.

On the second connection terminals 511a, 511b, 511c, ..., 511x, ... disposed in the second substrate mounting area 51B as the second substrate mounting area, the packaging substrate joint balls 5a, 5b, 5c, ..., 5x, ... of the first level assembly 57 are disposed. The first lands of the mounting base 30 of the first level assembly 57, which are not shown in FIG. 14 are connected so as to be in contact with the assembling substrate joint balls 5a, 5b, 5c, ..., 5x, ..., respectively.

In the first connection terminals 51a, 51b, 51c, ..., 51x, ... disposed in the first substrate mounting area 51A, for example, included are: an ADD terminal 51a for supplying the address signal; an input and output terminal 51b for supplying the input and output signal; chip selection terminals 51c and 51d for selecting the semiconductor chips; a GND terminal 51e; and a VDD terminal 51f and the like. The ADD terminal 51a, the input and output terminal 51b, the chip selection terminals 51c and 51d, the GND terminal 51e, and the VDD terminal 51f receive signals from the ADD signal terminal 53a, an input and output terminal 53b, chip selection signal terminals 53c and 53d, a GND signal terminal 53e, and a VDD signal terminal 53f. The second connection terminals 511a, 511b, 511c, ..., 511x, ... in the second substrate mounting area 51B include: the ADD terminal 511a for supplying the address signal; the input and output terminal 511b for supplying the input and output signal; the chip selection terminals 511c and 511d for selecting the semiconductor chip; the GND terminal 511e; the VDD terminal 511f, and the like. The ADD signal 511a, the input and output terminal 511b, the chip selection terminals 511c and 511d, the GND terminal 511e and the VDD terminal 511f receive signals from the ADD signal terminal 53a connected to the first signal wiring 52a, 52b, 52c, ..., 52f, the input and output signal terminal 53b, the chip selection signal terminals 53c and 53d, the GND signal terminal 53e and the VDD signal terminal 53f. The signal terminals 53a, 53b, 53c, ..., 53x, ... include a write signal terminal, a clock input signal terminal and the like, other than the ADD signal terminal 53a, the input and output terminal 53b, the chip selection signal terminals 53c and 53d, the GND signal terminal 53e and the VDD signal terminal 53f.

According to the second level assembly 400 of the third embodiment of the present invention, the thin-type first level assembly 57 using the BGA tape and the like, and the first level assembly 56 in which the first level assemblies 57 are stacked in multiple levels can be mounted onto one piece of the packaging substrate 50. The operation of the first level assembly 30 and the upper level assembly 31 of the first level assembly 56 can be performed independently by the chip selection signal terminals 53c and 53d, which are insulated from the other terminals.

Various modifications will become possible for those skilled in the art after receiving the teachings of the present disclosure without departing form the scope thereof.

What is claimed is:

1. A chip mounting substrate comprising:
   a mounting base defined by a first surface and a second surface opposite to the first surface;
   a plurality of first lands disposed on the first surface, being classified into first and second groups of the first lands;
   a plurality of second lands disposed on the second surface so as to face to the first lands, being classified into first and second groups of the second lands; and
   a bent connection path embedded in the mounting base so as to connect the first lands with the second lands.

2. The chip mounting substrate of claim 1, wherein the mounting base is a BGA tape.

3. A chip mounting substrate comprising:
   a mounting base defined by a first surface and a second surface opposite to the first surface;
   a plurality of first lands disposed on the first surface, being classified into first and second groups of the first lands; and
   a plurality of second lands disposed on the second surface so as to face to the first lands, being classified into first and second groups of the second lands, wherein the first group of the first lands are connected to the first group of the second lands just above the first group of the first lands, and the second group of the first lands include a first intra substrate connection terminal insulated from the second land just above the first intra substrate connection terminal, and the second group of the second lands include a second inter level connection terminal insulated from the first land just below the second inter level connection terminal, and the first intra substrate connection terminal and the second inter level connection terminal are connected by the bent connection path having a stair-step shape.

4. A first level assembly comprising:
   a mounting base defined by a first surface and a second surface opposite to the first surface;
   a plurality of first lands disposed on the first surface, being classified into first and second groups of the first lands;
   a plurality of second lands disposed on the second surface so as to face to the first lands, being classified into first and second groups of the second lands;
   a plurality of straight connection paths embedded in the mounting base so as to connect the first group of the first lands with the first group of the second lands just above the first group of the first lands;
   a bent connection path embedded in the mounting base so as to connect the first lands with the second lands; and
   a semiconductor chip mounted on a chip mounting area assigned adjacent to the second lands on the second surface.

5. The first level assembly of claim 4, wherein the mounting base is a BGA tape.

6. The first level assembly of claim 4, further comprising:
   a heat sink contacted to the semiconductor chip.

7. The first level assembly of claim 4, wherein the sum of the thickness of the first and second lands is equal to or larger than the thickness of the semiconductor chip.

8. The first level assembly of claim 4, wherein the semiconductor chip is mounted in a facedown configuration on the chip mounting area.

9. A first level assembly comprising:
   a mounting base defined by a first surface and a second surface opposite to the first surface;

a plurality of first lands disposed on the first surface, being classified into first and second groups of the first lands;

a plurality of second lands disposed on the second surface so as to face to the first lands, being classified into first and second groups of the second lands;

a plurality of straight connection paths embedded in the mounting base so as to connect the first group of the first lands with the first group of the second lands just above the first group of the first lands;

a plurality of joint balls disposed on the second lands, respectively;

an upper level mounting base defined by a third surface and a fourth surface opposite to the third surface;

a plurality of upper level first lands disposed on the third surface so as to connect with the joint balls, respectively, being classified into first and second groups of the upper level first lands;

a plurality of upper level second lands disposed on the fourth surface so as to face to the upper level first lands, respectively, being classified into first and second groups of the upper level second lands;

a plurality of second straight connection paths embedded in the upper level mounting base so as to connect the first group of the upper level first lands with the first group of the upper level second lands just above the first group of the upper level first lands; and an upper level semiconductor chip disposed in a chip mounting area assigned adjacent to the upper level second lands on the fourth surface.

10. A first level assembly comprising:

a mounting base defined by a first surface and a second surface opposite to the first surface;

a plurality of first lands disposed on the first surface, being classified into first and second groups of the first lands;

a plurality of second lands disposed on the second surface so as to face to the first lands, being classified into first and second groups of the second lands;

a plurality of straight connection paths embedded in the mounting base so as to connect the first group of the first lands with the first group of the second lands just above the first group of the first lands;

a plurality of joint balls disposed on the second lands, respectively;

an upper level mounting base defined by a third surface and a fourth surface opposite to the third surface;

a plurality of upper level first lands disposed on the third surface so as to connect with the joint balls, respectively, being classified into first and second groups of the upper level first lands;

a plurality of upper level second lands disposed on the fourth surface so as to face to the upper level first lands, respectively, being classified into first and second groups of the upper level second lands;

a plurality of second straight connection paths embedded in the upper level mounting base so as to connect the first group of the upper level first lands with the first group of the upper level second lands just above the first group of the upper level first lands; and an upper level semiconductor chip disposed in a chip mounting area assigned adjacent to the upper level second lands on the fourth surface, wherein the second group of the first lands include a first intra substrate connection terminal insulated from the second land just above the first intra substrate connection terminal, and the second group of the second lands include a second inter level connection terminal insulated from the first land just below the second inter level connection terminal, and the first intra substrate connection terminal and the second inter level connection terminal are connected by a bent connection path having a stair-step shape.

11. A first level assembly comprising:

a mounting base defined by a first surface and a second surface opposite to the first surface;

a plurality of first lands disposed on the first surface, being classified into first and second groups of the first lands;

a plurality of second lands disposed on the second surface so as to face to the first lands, being classified into first and second groups of the second lands;

a plurality of straight connection paths embedded in the mounting base so as to connect the first group of the first lands with the first group of the second lands just above the first group of the first lands;

a plurality of joint balls disposed on the second lands, respectively;

an upper level mounting base defined by a third surface and a fourth surface opposite to the third surface;

a plurality of upper level first lands disposed on the third surface so as to connect with the joint balls, respectively, being classified into first and second groups of the upper level first lands;

a plurality of upper level second lands disposed on the fourth surface so as to face to the upper level first lands, respectively, being classified into first and second groups of the upper level second lands;

a plurality of second straight connection paths embedded in the upper level mounting base so as to connect the first group of the upper level first lands with the first group of the upper level second lands just above the first group of the upper level first lands; and an upper level semiconductor chip disposed in a chip mounting area assigned adjacent to the upper level second lands on the fourth surface, wherein the mounting base is a BGA tape.

12. A first level assembly comprising:

a mounting base defined by a first surface and a second surface opposite to the first surface;

a plurality of first lands disposed on the first surface, being classified into first and second groups of the first lands;

a plurality of second lands disposed on the second surface so as to face to the first lands, being classified into first and second groups of the second lands;

a plurality of straight connection paths embedded in the mounting base so as to connect the first group of the first lands with the first group of the second lands just above the first group of the first lands;

a plurality of joint balls disposed on the second lands, respectively;

an upper level mounting base defined by a third surface and a fourth surface opposite to the third surface;

a plurality of upper level first lands disposed on the third surface so as to connect with the joint balls, respectively, being classified into first and second groups of the upper level first lands;

a plurality of upper level second lands disposed on the fourth surface so as to face to the upper level first lands, respectively, being classified into first and second groups of the upper level second lands;

a plurality of second straight connection paths embedded in the upper level mounting base so as to connect the first group of the upper level first lands with the first group of the upper level second lands just above the first group of the upper level first lands; and an upper level semiconductor chip disposed in a chip mounting area assigned adjacent to the upper level second lands on the fourth surface, wherein the upper level semiconductor chip is mounted in a facedown configuration on the chip mounting area.

13. A second level assembly comprising:

a packaging board defined by a first surface assigning a substrate mounting area;

a plurality of connection terminals disposed on the substrate mounting area;

a plurality of signal terminals disposed around the substrate mounting area on the first surface of the packaging board;

a plurality of signal wiring connected to the connection terminals and the signal terminals;

a plurality of packaging balls disposed on the connection terminals, respectively;

a mounting base disposed above the substrate mounting area, the mounting base being defined by a first surface and a second surface opposite to the first surface having a plurality of first lands disposed on the first surface, the first lands being classified into first and second groups of the first lands, a plurality of second lands disposed so as to face to the plurality of first lands on the second surface, the second lands being classified into first and second groups of the second lands, a plurality of straight connection paths embedded in the mounting base so as to connect the first group of the first lands with the first group of the second lands just above the first group of the first lands, and a plurality of bent connection paths embedded in the mounting base so as to connect the first lands with the second lands; and a semiconductor chip mounted on a chip mounting area assigned adjacent to the second lands on the second surface.

14. The second level assembly of claim 13, wherein the mounting base is a BGA tape.

15. The second level assembly of claim 13, wherein the semiconductor chip is mounted in a facedown configuration on the chip mounting area.

16. A second level assembly comprising:

a packaging board defined by a first surface assigning a substrate mounting area;

a plurality of connection terminals disposed on the substrate mounting area;

a plurality of signal terminals disposed around the substrate mounting area on the first surface of the packaging board;

a plurality of signal wiring connected to the connection terminals and the signal terminals;

a plurality of packaging balls disposed on the connection terminals, respectively;

a mounting base disposed above the substrate mounting area, the mounting base being defined by a first surface and a second surface opposite to the first surface having a plurality of first lands disposed on the first surface, the first lands being classified into first and second groups of the first lands, a plurality of second lands disposed so as to face to the plurality of first lands on the second surface, the second lands being classified into first and second groups of the second lands, a plurality of straight connection paths embedded in the mounting base so as to connect the first group of the first lands with the first group of the second lands just above the first group of the first lands; and a semiconductor chip mounted on a chip mounting area assigned adjacent to the second lands on the second surface, wherein the second group of the first lands include a first intra substrate connection terminal insulated from the second land just above the first intra substrate connection terminal, and the second group of the second lands include a second inter level connection terminal insulated from the first land just below the second inter level connection terminal, and the first intra substrate connection terminal and the second inter level connection terminal are connected by a bent connection path having a stair-step shape.

17. A second level assembly comprising:

a packaging board defined by a first surface assigning a substrate mounting area;

a plurality of connection terminals disposed on the substrate mounting area;

a plurality of signal terminals disposed around the substrate mounting area on the first surface of the packaging board;

a plurality of signal wiring connected to the connection terminals and the signal terminals;

a plurality of packaging balls disposed on the connection terminals, respectively;

a mounting base disposed above the substrate mounting area, the mounting base being defined by a first surface and a second surface opposite to the first surface having a plurality of first lands disposed on the first surface, the first lands being classified into first and second groups of the first lands, a plurality of second lands disposed so as to face to the plurality of first lands on the second surface, the second lands being classified into first and second groups of the second lands, a plurality of straight connection paths embedded in the mounting base so as to connect the first group of the first lands with the first group of the second lands just above the first group of the first lands;

a semiconductor chip mounted on a chip mounting area assigned adjacent to the second lands on the second surface;

a plurality of second connection terminals disposed in a second substrate mounting area assigned adjacent to the substrate mounting area on the packaging pad;

a plurality of second signal terminals disposed around the second substrate mounting area on the first surface of the packaging substrate;

a plurality of second signal wiring connected to the second connection terminals and the second signal terminals;

a plurality of second packaging balls respectively disposed on the second connection terminals;

a second mounting base disposed above the second substrate mounting area so as to lie in the same level of the first mounting base, the second mounting base, the second mounting base being defined by a first surface and a second surface opposite to the first surface having a plurality of first lands disposed on the first surface, the first lands being classified into first and second groups of the first lands, a plurality of second lands disposed so as to face to the plurality of first lands on the second surface, the second lands being classified into first and second groups of the second lands, and a plurality of straight connection paths embedded in the mounting base so as to connect the first group of the first lands with the first group of the second lands just above the first group of the first lands; and a semiconductor chip mounted on a second chip mounting area assigned on the second mounting base so as to be lie in the same level of the semiconductor chip.

18. A second level assembly comprising:

a packaging board defined by a first surface assigning a substrate mounting area;

a plurality of connection terminals disposed on the substrate mounting area;

a plurality of signal terminals disposed around the substrate mounting area on the first surface of the packaging board;

a plurality of signal wiring connected to the connection terminals and the signal terminals:

a plurality of packaging balls disposed on the connection terminals, respectively;

a mounting base disposed above the substrate mounting area, the mounting base being defined by a first surface and a second surface opposite to the first surface having a plurality of first lands disposed on the first surface, the first lands being classified into first and second groups of the first lands, a plurality of second lands disposed so as to face to the plurality of first lands on the second surface, the second lands being classified into first and second groups of the second lands, a plurality of straight connection paths embedded in the mounting base so as to connect the first group of the first lands with the first group of the second lands just above the first group of the first lands;

a semiconductor chip mounted on a chip mounting area assigned adjacent to the second lands on the second surface;

a plurality of joint balls disposed on the second lands respectively on the mounting base;

an upper level mounting base disposed above the mounting base, being defined by a third surface and a fourth surface opposite to the third surface;

a plurality of upper level first lands disposed on the third surface so as to connect with the joint balls, respectively, being classified into first and second groups of the upper level first lands;

a plurality of upper level second lands disposed so as to face to the upper level first lands, respectively, being classified into first and second groups of the upper level second lands;

a plurality of second straight connection paths embedded in the upper level mounting base so as to connect the first group of the upper level first lands with the first group of the upper level second lands just above the first group of the upper level first lands; and an upper level semiconductor chip disposed in a upper level chip mounting area assigned adjacent to the upper level second lands on the fourth surface.

19. A second level assembly comprising:

a packaging board defined by a first surface assigning a substrate mounting area;

a plurality of connection terminals disposed on the substrate mounting area;

a plurality of signal terminals disposed around the substrate mounting area on the first surface of the packaging board;

a plurality of signal wiring connected to the connection terminals and the signal terminals;

a plurality of packaging balls disposed on the connection terminals, respectively;

a mounting base disposed above the substrate mounting area, the mounting base being defined by a first surface and a second surface opposite to the first surface having a plurality of first lands disposed on the first surface, the first lands being classified into first and second groups of the first lands, a plurality of second lands disposed so as to face to the plurality of first lands on the second surface, the second lands being classified into first and second groups of the second lands, a plurality of straight connection paths embedded in the mounting base so as to connect the first group of the first lands with the first group of the second lands just above the first group of the first lands;

a semiconductor chip mounted on a chip mounting area assigned adjacent to the second lands on the second surface;

a plurality of joint balls disposed on the second lands respectively on the mounting base;

an upper level mounting base disposed above the mounting base, being defined by a third surface and a fourth surface opposite to the third surface;

a plurality of upper level first lands disposed on the third surface so as to connect with the joint balls, respectively, being classified into first and second groups of the upper level first lands;

a plurality of upper level second lands disposed so as to face to the upper level first lands, respectively, being classified into first and second groups of the upper level second lands;

a plurality of second straight connection paths embedded in the upper level mounting base so as to connect the first group of the upper level first lands with the first group of the upper level second lands just above the first group of the upper level first lands; and an upper level semiconductor chip disposed in a upper level chip mounting area assigned adjacent to the upper level second lands on the fourth surface, wherein the second group of the first lands include a first intra substrate connection terminal insulated from the second land just above the first intra substrate connection terminal, and the second group of the second lands include a second inter level connection terminal insulated from the first land just below the second inter level connection terminal, and the first intra substrate connection terminal and the second inter level connection terminal are connected by a bent connection path having a stair-step shape.

20. A second level assembly comprising:

a packaging board defined by a first surface assigning a substrate mounting area;

a plurality of connection terminals disposed on the substrate mounting area;

a plurality of signal terminals disposed around the substrate mounting area on the first surface of the packaging board;

a plurality of signal wiring connected to the connection terminals and the signal terminals;

a plurality of packaging balls disposed on the connection terminals, respectively;

a mounting base disposed above the substrate mounting area, the mounting base being defined by a first surface and a second surface opposite to the first surface having a plurality of first lands disposed on the first surface, the first lands being classified into first and second groups of the first lands, a plurality of second lands disposed so as to face to the plurality of first lands on the second surface, the second lands being classified into first and second groups of the second lands, a plurality of straight connection paths embedded in the mounting base so as to connect the first group of the first lands with the first group of the second lands just above the first group of the first lands;

a semiconductor chip mounted on a chip mounting area assigned adjacent to the second lands on the second surface;

a plurality of joint balls disposed on the second lands respectively on the mounting base;

an upper level mounting base disposed above the mounting base, being defined by a third surface and a fourth surface opposite to the third surface;

a plurality of upper level first lands disposed on the third surface so as to connect with the joint balls, respectively, being classified into first and second groups of the upper level first lands;

a plurality of upper level second lands disposed so as to face to the upper level first lands, respectively, being classified into first and second groups of the upper level second lands;

a plurality of second straight connection paths embedded in the upper level mounting base so as to connect the first group of the upper level first lands with the first group of the upper level second lands just above the first group of the upper level first lands; and an upper level semiconductor chip disposed in a upper level chip mounting area assigned adjacent to the upper level second lands on the fourth surface, wherein the mounting base is a BGA tape.

* * * * *